Figure 1:
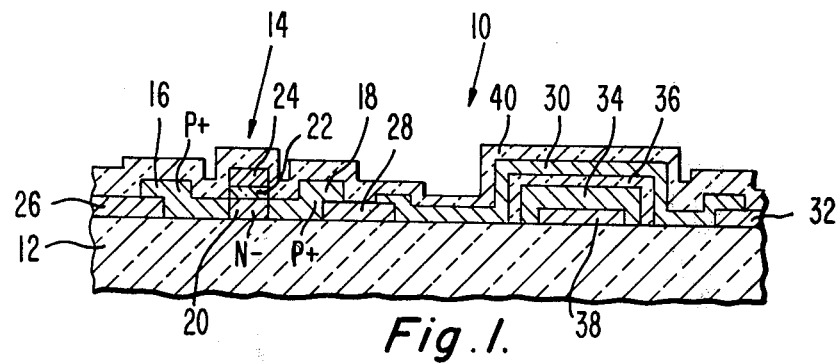

United States Patent [19]

Ipri et al.

[11] 4,169,746

[45] Oct. 2, 1979

[54] METHOD FOR MAKING SILICON ON SAPPHIRE TRANSISTOR UTILIZING PREDEPOSITION OF LEADS

[75] Inventors: Alfred C. Ipri; Joseph H. Scott, Jr., both of Princeton, N.J.

[73] Assignee: RCA Corp., New York, N.Y.

[21] Appl. No.: 930,381

[22] Filed: Aug. 2, 1978

Related U.S. Application Data

[62] Division of Ser. No. 791,945, Apr. 28, 1977, Pat. No. 4,119,992.

[51] Int. Cl.² .................. H01L 21/86; H01L 21/88; H01L 29/72
[52] U.S. Cl. .................. 148/175; 29/571; 148/174; 148/187; 357/4; 357/23; 357/49
[58] Field of Search .................. 148/174, 175, 187; 29/571; 357/4, 23, 49

[56] References Cited

U.S. PATENT DOCUMENTS

| | | | |
|---|---|---|---|
| 3,191,061 | 6/1965 | Weimer | 357/4 X |
| 3,258,663 | 6/1966 | Weimer | 357/4 |
| 3,304,469 | 2/1967 | Weimer | 357/4 |
| 3,385,731 | 5/1968 | Weimer | 357/4 X |
| 3,405,331 | 10/1968 | Skalski et al. | 357/4 |
| 3,460,240 | 8/1969 | Tarneja et al. | 148/175 X |
| 3,616,527 | 11/1971 | Janning | 148/174 |
| 3,872,492 | 3/1975 | Robbins | 357/23 |

OTHER PUBLICATIONS

Weimer, P. K., "Integrated Thin-Film Circuits—Elements", Trans. Metall. Soc. of AIME, vol. 236, Mar. 1966, pp. 250–256.

*Primary Examiner*—L. Dewayne Rutledge
*Assistant Examiner*—W. G. Saba
*Attorney, Agent, or Firm*—H. Christoffersen; Sanford J. Asman

[57] ABSTRACT

The integrated circuit is manufactured upside down relative to conventional silicon-on-sapphire (SOS) processing techniques for manufacturing field effect transistors. First a conductive pattern, typically of a refractory metal, is deposited and defined on an insulating substrate, such as sapphire, and then silicon transistors are formed over the conductive pattern. Using the process, a masking step, namely the contact definition mask, used in conventional SOS manufacture, is eliminated.

5 Claims, 5 Drawing Figures

METHOD FOR MAKING SILICON ON SAPPHIRE TRANSISTOR UTILIZING PREDEPOSITION OF LEADS

This is a division of application Ser. No. 791,945, filed Apr. 28, 1977, U.S. Pat. No. 4,119,992.

The present invention relates to the manufacture of integrated circuit devices. In particular, the invention relates to the manufacture of SOS field effect transistor integrated circuits.

In the conventional manufacturing of integrated circuits employing field effect transistors on a sapphire substrate, one starts with single crystal aluminum oxide ($Al_2O_3$), called sapphire, on which a silicon epitaxial layer is grown. The epitaxial layer is defined into islands which are covered with an oxide layer. Polycrystalline silicon gates are deposited and defined over the gate oxide layer and then source and drains are formed either by diffusion or ion implantation. In order to contact the source and drain of a conventionally formed SOS transistor a photomask must be used to define openings in the oxide layer for metal contact deposition.

In view of the fact that the yield of semiconductor devices is inversely proportional to the number of masking steps which are used in the manufacture of the devices, and further in view of the processing required to form a contact opening and the problem associated with the step formed in the metallization by the oxide coating overlying the source and drain of the transistor, a process which would provide planar metallization layers and which would simultaneously eliminate the need for a masking step would be desirable.

In the drawings;

FIG. 1 is a cross sectional view of a portion of an integrated circuit structure formed by the method of the present invention; and FIGS. 2-5 illustrate the method of forming the structure of FIG. 1.

Referring now to FIG. 1, a portion of an integrated circuit structure 10 is shown. The structure 10 comprises a substrate 12 of insulating material such as single crystal aluminum oxide ($Al_2O_3$), i.e. sapphire. Other materials such as spinel may be substituted as a substrate material. overlying the substrate 12 there is at least one conductor-insulator-semiconductor (CIS) field effect transistor (FET) 14 which in this example is a P channel device which comprises a P+ source region 16, a P+ drain region 18, and an N− channel region 20 formed therebetween. Overlying the channel region 20 is an insulating layer 22 over which a conductive gage 24 lies. In the present embodiment, the gate 24 is a polycrystalline silicon gate. Contact is made to the drain 16 and to the source region 18 via conductors 26, 28, respectively, which in the present embodiment are comprised of a refractory metal such as tungsten or molybdenum but which may be any metal having a melting point such that the metal will not melt during the processing of the structure as explained hereinafter. A polycrystalline silicon conductor 30 is shown to be separated from a polycrystalline silicon conductor 34 by an insulating layer 36, which in the present embodiment is comprised of silicon dioxide. The silicon conductive layer 34 makes contact to yet another refractory metal conductor 38 which tunnels over the insulating layer 36. Overlying the portion of the integrated structure 10 is a protective oxide layer 40.

Figure 2:
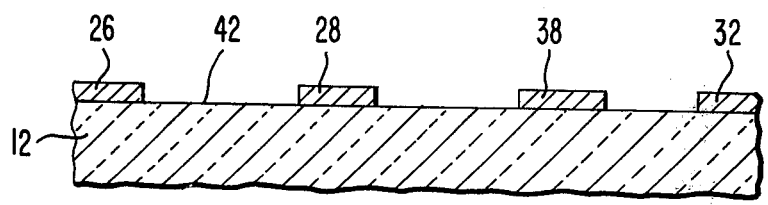

Referring to FIG. 2, one manufactures the integrated circuit structure 10 by starting with an insulating substrate 12 on which a semiconductor layer can be epitaxially grown as a single crystal.

On a surface 42 of the substrate 12 a layer of refractory metal such as tungsten or molybdenum or any other material with an adequately high melting point is applied by any suitable method. For example, metal may be applied by either evaporation, sputtering or chemical vapor deposition (CVD). In a CVD process for applying tungsten, which is the metal used in the preferred embodiment of the present invention, tungsten is deposited by the pyrolytic decomposition of tungsten hexafluoride ($WF_6$) in an atmosphere which is inert for that purpose, such as hydrogen gas, at about 600° C. After applying the tungsten layer, a layer of photoresist (not shown) is applied over the layer and a first phtotomask is used to define conductors 26, 28, 38 and 32, and the balance of the tungsten layer is removed by etching with potassium hydroxide (KOH) and potassium ferricyanide ($K_3Fe(CN)_6$). Then, the balance of the photoresist layer is removed.

Figure 3:
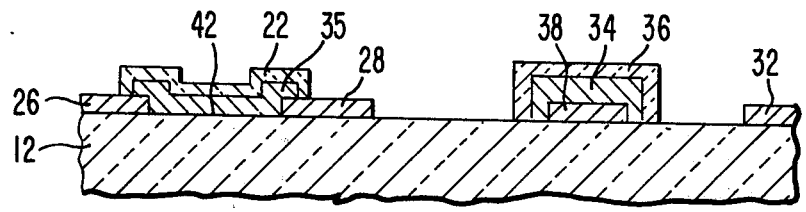

Referring now to FIG. 3, one next places the substrate 12 into a reactor where silicon is deposited by the pyrolytic decomposition of silane ($SiH_4$) in hydrogen ($H_2$) at 1000° C. Because of the presence of both the sapphire surface 42, on which single crystal silicon can grow epitaxially, and the tungsten conductors 26, 28, 38 and 32, on which polycrystalline silicon can grown, the layer formed by the decomposition of silane will be single crystal silicon over the sapphire surface 42 but will be polycrystalline on and adjacent the tungsten conductors 26, 28, 38 and 32.

In the preferred embodiment of the invention the deposited layer of silicon is doped with donor impurities, such as phosphorus, so that the layer formed will have about $2 \times 10^{15}$ donor impurities/cc. The silicon layer is grown to a thickness of about 6000Å. A layer of photoresist is deposited over the silicon layer thus formed, and using a second photomask (not shown) the silicon layer is defined into regions which will become polycrystalline silicon conductors, which overlie metal conductors, such as region 34 and regions which will become CIS field effect transistors, such as region 35.

Next, the substrate 12 is placed into a reactor, heated to about 900° C. in steam and a small quantity of HCl to grow a layer of silicon dioxide over the silicon layers 34, 35. The silicon dioxide layers 22, 36 will grow to a thickness of about 1000Å in about 50 minutes.

Figure 4:
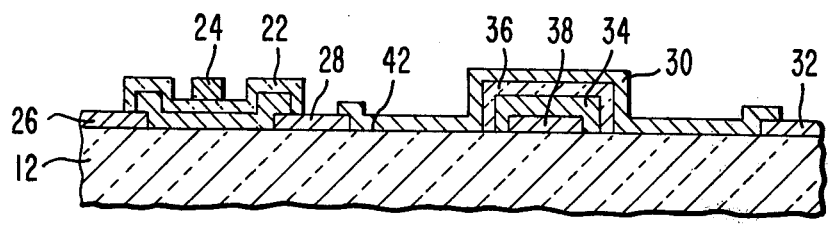

Referring now to FIG. 4, the substrate 12 is next placed into a deposition reactor heated to between about 700° C. and 1000° C. to deposit a layer of silicon over the oxide layers 22 and 36 and over the exposed portions of the surface 42 of the substrate and over the exposed portions of the metal conductors 26, 28 and 32. If the temperature is on the order of about 700° C. only polycrystalline silicon will be deposited. A layer of photoresist (not shown) is deposited over the polycrystalline silicon layer and the polycrystalline silicon layer is defined using a third photomask (not shown). Then, the defined polycrystalline silicon layer is etched and the balance of photoresist material is removed in order to form the gate 24 and the polycrystalline conductor 30.

Using the polycrystalline silicon gate 24 as a mask, the portions of the oxide layer 22 which do not underlie the layer 24 are removed by etching in a solution of KOH and N-proponal.

Figure 5:
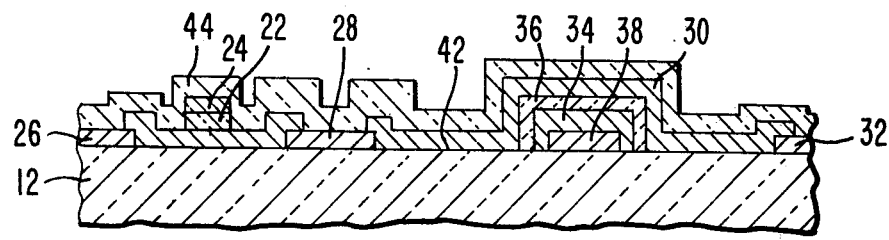

Referring to FIG. 5, an oxide layer which is doped with an acceptor impurity, such as boron, in order to form P channel transistors, or with a donor impurity such as phosphorus, in order to form N channel transistors, is deposited over the surface of the substrate. In order to manufacture the structure 10 shown in FIG. 1, a boron doped oxide layer 44 is deposited over the entire surface of the substrate.

If only devices of one polarity, i.e. only P channel devices, are to be formed, the wafer is then placed in a diffusion furnace to drive impurities from the layer 44 into the layer 35 thereby forming the P+ source and P+ drain 18 as shown in FIG. 1.

If complementary symmetry devices are to be formed, the boron doped oxide layer 44 is defined using a layer of photoresist and a photomask, and then a phosphorus or other doped oxide layer is deposited over those transistors which are to be N-channel. Then the drive-in diffusion takes place.

Following the drive-in diffusion, the oxide layer 44 may be stripped and a clean oxide layer 40 is formed over the entire surface of the substrate 12. Pad openings are defined in the oxide layer 40 by a fourth photomask (fifth photomask in the case of complementary devices), thereby completing the structure 10.

The manufacture of semiconductor integrated circuit structures in accordance with the present invention does not require a metal contact opening mask. Also, the metal conductive layers are formed directly over the planar surface 42 of the sapphire substrate which means that the problem of stepped metallization is eliminated. By eliminating the stepped metallization, narrower metal spacings can be used than would otherwise be required in the conventional manufacturing of devices. Therefore, smaller devices can be made.

We claim:

1. A method of making an integrated circuit structure comprising:
   (a) selecting an insulating body upon which a single crystal semiconductor device may be epitaxially deposited;
   (b) forming a series of conductors on a surface of said body;
   (c) epitaxially depositing semiconductor material on the exposed portions of said body and over said conductors;
   (d) defining said semiconductor material into transistors overlying said body and into first conductive regions overlying said conductors;
   (e) forming insulating layers over said transistors and first conductive regions;
   (f) forming second conductive gate regions over said insulating layers overlying said transistors while simultaneously forming conductive crossovers overlying said insulating layers which overlie said first conductive region; and
   (g) adding impurities to said transistors in order to form a source and drain in the area of said transistors which do not overlie said gate regions.

2. The method of claim 1 wherein said series of conductors is formed by chemical vapor deposition of a refractory metal.

3. The method of claim 2 wherein said semiconductor material is epitaxially deposited by pyrolytically decomposing silane.

4. The method of claim 3 wherein said impurities are added by diffusion impurities forming doped oxide into said semiconductor material.

5. The method of claim 1 further comprising adding impurities of a second type to form transistors in order to form an integrated circuit structure having both P channel transistors and N channel transistors.

* * * * *